(12) United States Patent
Rubin et al.

(10) Patent No.: US 12,364,004 B2
(45) Date of Patent: Jul. 15, 2025

(54) DUMMY FIN CONTACT IN VERTICALLY STACKED TRANSISTORS

(71) Applicant: International Business Machines Corporation, Armonk, NY (US)

(72) Inventors: Joshua M. Rubin, Albany, NY (US); Chen Zhang, Guilderland, NY (US); Tenko Yamashita, Schenectady, NY (US); Brent A Anderson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 17/847,765

(22) Filed: Jun. 23, 2022

(65) Prior Publication Data
US 2023/0420458 A1 Dec. 28, 2023

(51) Int. Cl.
| H10D 84/85 | (2025.01) |
| H10D 30/01 | (2025.01) |
| H10D 30/67 | (2025.01) |
| H10D 64/62 | (2025.01) |
| H10D 84/01 | (2025.01) |
| H10D 84/03 | (2025.01) |
| H10D 88/00 | (2025.01) |

(52) U.S. Cl.
CPC ......... H10D 84/856 (2025.01); H10D 30/031 (2025.01); H10D 30/6728 (2025.01); H10D 30/6729 (2025.01); H10D 64/62 (2025.01); H10D 84/0186 (2025.01); H10D 84/0195 (2025.01); H10D 84/038 (2025.01); H10D 88/01 (2025.01)

(58) Field of Classification Search
CPC ............ H01L 27/0922; H01L 21/8221; H01L 21/823871; H01L 21/823885; H01L 29/41733; H01L 29/45; H01L 29/66742; H01L 29/78642; H01L 21/823475; H01L 21/823487; H01L 27/0688; H01L 27/088
See application file for complete search history.

(56) References Cited

U.S. PATENT DOCUMENTS

| 9,177,890 B2 | 11/2015 | Du |
| 9,659,963 B2 * | 5/2017 | Cheng ................ H01L 27/1211 |
| 9,824,933 B1 * | 11/2017 | Pawlak ........... H01L 21/823487 |

(Continued)

FOREIGN PATENT DOCUMENTS

| CN | 110957314 A | * | 4/2020 | ....... H01L 21/02603 |
| CN | 111383996 A | * | 7/2020 | ..... H01L 21/823807 |

(Continued)

*Primary Examiner* — Mohammed Shamsuzzaman
(74) *Attorney, Agent, or Firm* — Kimberly Zillig

(57) ABSTRACT

A plurality of transistor components, a system, and a method of forming a vertically stacked transistor structure within a wafer. The plurality of transistor components may include a first bottom transistor, where the first bottom transistor includes a channel, a gate, a source, and a drain. The plurality of transistor components may also include a first contact on top of the first bottom transistor, where the first contact is proximately connected to the first bottom transistor. The plurality of transistor components may also include a first set of stacked transistors, where the first set of stacked transistors includes a second top transistor on top of a second bottom transistor.

11 Claims, 17 Drawing Sheets

(56) References Cited

U.S. PATENT DOCUMENTS

| | | | |
|---|---|---|---|
| 9,997,413 B1 | 6/2018 | Leobandung | |
| 10,002,803 B2* | 6/2018 | Cheng | H01L 29/66795 |
| 10,068,794 B2 | 9/2018 | Schultz | |
| 10,361,128 B2 | 7/2019 | Anderson et al. | |
| 10,636,791 B1 | 4/2020 | Rubin | |
| 10,991,711 B2* | 4/2021 | Reznicek | H01L 29/66545 |
| 11,056,396 B1* | 7/2021 | Wu | H01L 21/823412 |
| 11,476,348 B2* | 10/2022 | Wu | H01L 29/0649 |
| 11,676,966 B2* | 6/2023 | Dewey | H01L 23/3128 |
| | | | 257/369 |
| 11,735,590 B2* | 8/2023 | Cheng | H01L 21/823878 |
| | | | 257/369 |
| 11,848,365 B2* | 12/2023 | Lee | H01L 29/66553 |
| 11,894,373 B2* | 2/2024 | Yang | H01L 21/823418 |
| 11,894,436 B2* | 2/2024 | Frougier | H01L 29/775 |
| 11,901,236 B2* | 2/2024 | Chu | H01L 21/823456 |
| 11,996,411 B2* | 5/2024 | Huang | H01L 29/7851 |
| 12,027,607 B2* | 7/2024 | Colombeau | H01L 21/02603 |
| 2009/0087956 A1* | 4/2009 | Rao | H01L 21/7684 |
| | | | 438/618 |
| 2014/0191246 A1* | 7/2014 | Oraw | H01L 25/167 |
| | | | 438/25 |
| 2014/0252306 A1* | 9/2014 | Du | H01L 29/0673 |
| | | | 977/762 |
| 2016/0380002 A1* | 12/2016 | Cheng | H01L 21/30604 |
| | | | 438/157 |
| 2017/0287902 A1* | 10/2017 | Balakrishnan | H01L 29/517 |
| 2017/0309527 A1* | 10/2017 | Cheng | H01L 21/6835 |
| 2017/0358607 A1* | 12/2017 | Balakrishnan | H01L 21/02532 |
| 2018/0175023 A1* | 6/2018 | Visokay | H01L 23/522 |
| 2020/0098756 A1* | 3/2020 | Lilak | H01L 21/823807 |
| 2020/0105751 A1* | 4/2020 | Dewey | H01L 21/8256 |
| 2020/0335581 A1* | 10/2020 | Li | H01L 29/7831 |
| 2020/0343387 A1* | 10/2020 | Liaw | H01L 27/0922 |
| 2022/0301936 A1* | 9/2022 | Merchant | H01L 21/28518 |
| 2022/0310456 A1* | 9/2022 | Hall | H01L 21/823807 |
| 2023/0040387 A1* | 2/2023 | Lai | H01L 29/775 |
| 2023/0051674 A1* | 2/2023 | Wu | H01L 21/76897 |
| 2023/0054540 A1* | 2/2023 | Xie | H01L 27/0886 |
| 2023/0090346 A1* | 3/2023 | Xie | H01L 21/823431 |
| | | | 257/398 |
| 2023/0420544 A1* | 12/2023 | Mertens | H01L 29/42392 |
| 2024/0072136 A1* | 2/2024 | Lin | H01L 29/41733 |
| 2024/0203985 A1* | 6/2024 | Xie | H01L 27/088 |
| 2024/0203992 A1* | 6/2024 | Xie | H01L 29/66439 |
| 2024/0282771 A1* | 8/2024 | Fulford | H01L 29/775 |

FOREIGN PATENT DOCUMENTS

| | | | | |
|---|---|---|---|---|
| CN | 113228231 A | * | 8/2021 | H01L 21/2256 |
| CN | 114078766 A | * | 2/2022 | H01L 29/42392 |

* cited by examiner

DUMMY FIN CONTACT IN VERTICALLY STACKED TRANSISTORS

BACKGROUND

The present disclosure relates to stacked transistors and, more specifically, to forming a contact to a bottom transistor using a dummy fin.

Transistors are devices used to switch or amplify electric current or voltage. Field-effect transistors (FETs) use an electric field effect to control current flow within a semiconductor. FETs may have three terminals—a source, a drain, and a gate. The source may introduce/provide current to the FET. The drain may be the terminal where the current leaves the FET. The gate may be used to control the current flow from the source to the drain. Specifically, FETs may use the electric charge of their gates to affect and control the current flow through the FET channel. Current may flow through the FET using charge carriers that may be either electrons or holes. Electron charge carriers may be negatively charged particles (i.e., electrons) that carry charge and create an electric current. Hole charge carriers (referred to herein as holes) are positions on the FET channel that lack an electron (for instance, at positions where an electron could or should be). These holes may be positive charges, and they may move in an opposite direction of electrons, in some instances. This may result in a current of positive charge created by the holes. The electric charge and/or voltage of the FET gates may be used to control the movements of the electrons and/or holes, which may then affect the current and charge being transmitted through the channel from the source to the drain.

SUMMARY

The present invention provides a plurality of transistor components, a system, and a method of forming a vertically stacked transistor structure within a wafer. The plurality of transistor components may include a first bottom transistor, where the first bottom transistor includes a channel, a gate, a source, and a drain. The plurality of transistor components may also include a first contact on top of the first bottom transistor, where the first contact is proximately connected to the first bottom transistor. The plurality of transistor components may also include a first set of stacked transistors, where the first set of stacked transistors includes a second top transistor on top of a second bottom transistor.

The system may include a plurality of transistor components. The plurality of transistor components may include a first bottom transistor, where the first bottom transistor includes a channel, a gate, a source, and a drain. The plurality of transistor components may also include a first contact on top of the first bottom transistor, where the first contact is proximately connected to the first bottom transistor, and where the first contact replaces a first top transistor.

The method may include forming a first channel and a second channel. The method may also include forming a first transistor including the first channel. The method may also include forming a second transistor including the second channel, where the second transistor is on top of a first transistor. The method may also include patterning an opening through the second transistor, where the opening exposes the first transistor. The method may also include filling the opening with a conductor material, resulting in a contact, where the contact is proximately connected to the first transistor.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
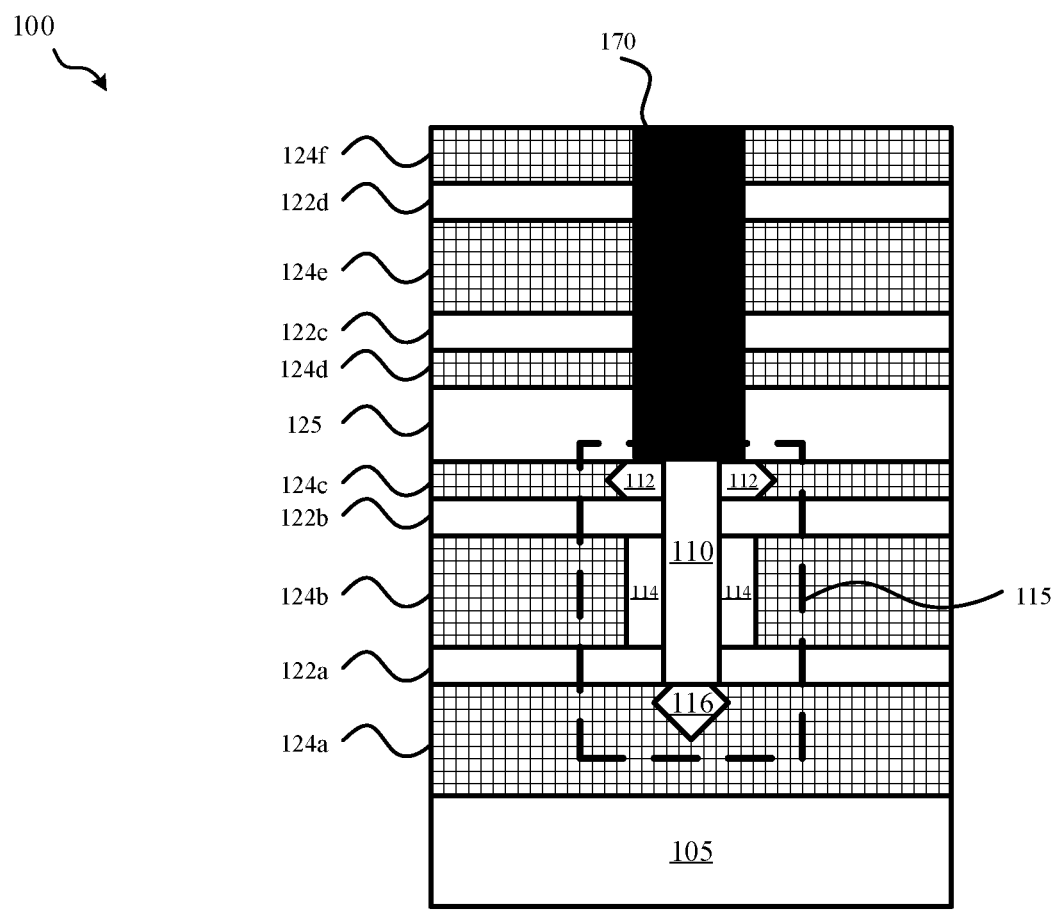
FIG. 1 depicts a vertically stacked FET structure with a dummy fin contact, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to stacked transistors and, more specifically, to forming a contact to a bottom transistor using a dummy fin. While the present disclosure is not necessarily limited to such applications, various aspects of the disclosure may be appreciated through a discussion of various examples using this context.

Transistors, such as field-effect transistors (FETs), may be used within a system (for example, within a semiconductor) to switch or amplify electric current or voltage. FETs may have two typical configurations, N-channel FETs (NFETs) and P-channel FETs (PFETs). In some instances, it may be beneficial to have multiple FETs connected to each other. For example, in logic gate designs, an N-gate from an NFET may need to be electrically connected to a P-gate from a PFET in order to form an input for the logic gate. A logic gate may typically be a circuit with one or more inputs but only one output, but may also include special cases where there is more than one output. Because an NFET has electrons as the majority carrier, typical NFETs pass a signal (i.e., conduct current) when the gate voltage is high. On the other hand, because a PFET has holes as the majority carrier, typical PFETs pass a signal (i.e., conduct current) when the gate voltage is low.

In some instances, combining NFET and PFET in a logic gate design can eliminate large current leakage from VDD (a positive supply voltage) to ground in a static/non-switching period, as one of the transistors will be off which may prevent different shorts between VDD and ground. This design is conventionally referred to as a complementary metal-oxide-semiconductor (CMOS) logic design. Because of the benefits of combining NFET and PFET in a logic gate design, various logic designs may include NFET and PFET pairs, and in each NFET-PFET pair the transistors may share the same input (i.e., their gates are electrically connected), in some instances. In various other circuit designs, it may be beneficial to not connect NFET and PFET within the NFET-PFET pair or to not have an NFET-PFET pair at all. As technology advances, it has become more and more beneficial to have large amounts of technology and components in very small spaces. Therefore, scaling device components to decrease the size of the various components may be very advantageous. For instance, in complementary metal-oxide-semiconductors (CMOS) or any other semiconductors, area scaling may help reduce the dimensions of the technology/components (for example, the dimensions of the base of the components) without reducing the capabilities of the components. One method of area scaling within a semiconductor is to stack transistors. Stacking transistors may increase the height of the semiconductor chip, but may reduce the area on the chip taken up by transistors. This may help scale the area of the chip, in some instances, which may allow for more components on the surface of a chip or may allow for a smaller chip.

For example, for logic gate designs, the connected NFET and PFET may be stacked on top of each other in order to have the benefit of the NFET-PFET pair (discussed above) while also saving space and reducing the area on the chip taken up by the NFET and PFET. However, there may be various challenges when forming stacked transistors. For instance, when forming stacked transistors, such as vertical transport field effect transistors (VTFETs), there may be aspect ratio issues as the process may involve a high aspect-ratio structure (where the vertical dimensions of the structure exceed the horizontal dimensions) and high aspect-ratio structures may be difficult to form due to their large vertical dimensions and the small amount of space within the chip/structure. To help resolve aspect ratio challenges, the stacked transistors may be formed by processing the top fin first and then flipping the wafer to process the bottom fin. This may result in the bottom transistor being formed from the top fin and the top transistor being formed from the bottom fin once the wafer has been flipped and the bottom fin becomes the top fin.

However, one problem with such a process is that the transistors (for example, nFETs and pFETs) are typically stacked directly on top of each other, even if the particular layout does not require both transistors. Put differently, the formation of one transistor may be tied to the formation of the second transistor (for instance, when the system is forming multiple groups of stacked transistors) and the transistors may be formed together as stacked transistors, even when only a single transistor is necessary. For example, the formation process of forming a bottom transistor, flipping the wafer, and forming a top transistor may be used to form a plurality of stacked transistors on the same wafer. However, in this example, there may be one set of stacked transistors that does not actually require both transistors and instead only needs a single transistor. But because multiple sets of stacked transistors are being formed at the same time, it may not be possible (or at least may be very difficult and time consuming) to form the sets of stacked transistors in addition to a single transistor at the same time.

Therefore, the present disclosure provides a stacked transistor structure, a system, and a method to form a contact to a bottom transistor using a dummy fin. Specifically, when it is not required and/or desired to have both transistors, the top fin and top transistor may be a dummy fin with no intended functionality. This dummy fin may be formed using the same/similar methods as the formation of actual transistors and therefore may be formed at the same time as the other transistors on the wafer. Then, the dummy fin may be replaced by a self-aligned contact structure that is contacting/connected to the bottom transistor in the stacked transistor structure. This way, the bottom transistor may still be accessible through the contact, however there may not be an unnecessary top transistor when the top transistor is not needed. The self-aligned contact may also be referred to as a dummy fin contact, herein.

Referring now to FIG. 1, stacked transistor structure 100 is depicted, according to some embodiments. FIG. 1, and stacked transistor structure 100, depicts a single stacked transistor and a dummy fin contact 170, however a wafer may include any number of stacked transistors and dummy fin contacts. Stacked transistor structure 100 may have been a set of stacked transistors with a bottom transistor 115 and a top transistor (not depicted). The bottom transistor includes a channel 110, gates 114, top source/drain (S/D) region 112, and bottom S/D region 116. S/D region 112 and 116 may both be diffusion regions, with S/D region 112 (referred to herein as S/D 112, top S/D 112, etc.) being a source and S/D region 116 (referred to herein as S/D 116, bottom S/D 116, etc.) being a drain, or vice versa. Stacked transistor structure 100 is formed above a substrate 105 and includes various gate spacers 122a-d (referred to collectively as gate spacers 122) and dielectric layers 124a-f (referred to collectively as dielectric layers 124).

The gate spacers 122 may be used in the formation process (discussed further herein) to achieve the proper and/or necessary placement and spacing between the various components of the stacked transistor structure 100 (e.g., bottom S/D 116, gates 114, top S/D 112, etc.). In some instances, the gate spacers 122 may be made of materials such as silicon nitride (SiN), silicon oxynitride (SiON), silicon carbonate (SiCO), silicon boron carbonitride (SiBCN), etc. The dielectric layers 124 may be used to help protect the components of the stacked transistor structure 100 from other components of the chip, integrated circuit, and/or computer systems and may also fill the space between gate spacers 122. For instance, the stacked transistor structure 100 may be in close contact with other components, and the dielectric layers 124 may prevent any unwanted heat transfer and/or electric transfer between components. In some instances, dielectric layers 124 may be interlayer dielectric (ILD) and may be a material such as silicon dioxide ($SiO_2$) or any other applicable dielectric material.

Stacked transistor structure 100 also includes an isolation layer 125 to separate the bottom transistor 115 from the top transistor (not depicted). Isolation layer 125 may be a material such as silicon nitride (SiN), silicon oxynitride (SiON), silicon carbonate (SiCO), silicon boron carbonitride (SiBCN), etc.

As discussed above, there may be instances where both transistors in a set of stacked transistors are not required and only a single transistor is needed. Stacked transistor structure 100 depicts one such instance. For stacked transistor structure 100, only bottom transistor 115 may be needed for the chip, circuit, computer system, etc. However, it may have been difficult to only form a single bottom transistor 115 without forming a top transistor (not depicted). For example, stacked transistor structure 100 may be formed simultaneously with other sets of stacked transistors on a chip. Therefore, instead of only forming bottom transistor 115, a top transistor (not depicted) may have also been formed. However, the top transistor may have been a dummy transistor (also referred to herein as a dummy fin) with no intended functionality. After the top transistor was formed, the top transistor has been replaced with contact 170 (this process is further discussed herein). Contact 170 may also be referred to herein as dummy fin contact 170, as the contact 170 was formed in the location of the dummy fin and replaced the dummy fin/transistor. Contact 170 provides a contact/connection between bottom transistor 115 and other components of the chip and/or device (not depicted). This way, bottom transistor 115 may still be functional and may not be isolated from other components. Dummy fin contact 170 may be a conductor material such as titanium nitride (TiN), tantalum nitride (TaN), titanium, copper, cobalt, tungsten, or any other conductor material.

Dummy fin contact 170 may be described herein as proximately connected to bottom transistor 115. The term "proximately connected" may be used herein to describe a connection between two components, specifically components that are directly connected to or touching each other, and/or, for example, components that would be directly connected but for the oxide layer between them. For example, top S/D 112 may be proximately connected to channel 110, as they are in direct contact with each other. However, top S/D 112 may not be proximately connected to bottom S/D 116, as they are separated by various components and are not in direct contact with each other. Therefore, although top S/D 112 and bottom S/D 116 may have an electrical connection to each other, they may not be proximately connected to each other. Instead, top S/D 112 and bottom S/D 116 may each be proximately connected to channel 110.

Figure 2:
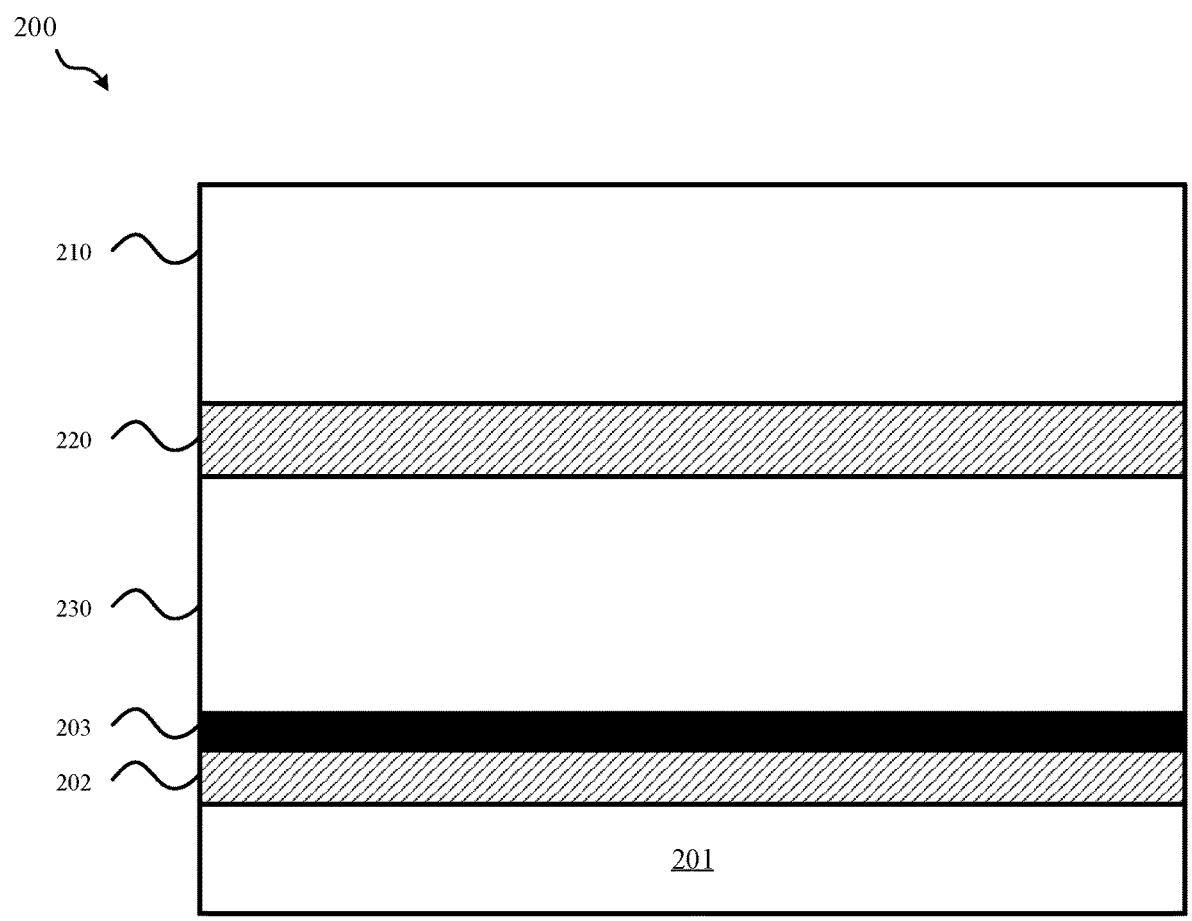
FIG. 2 depicts an intermediate step for forming stacked transistors with a dummy fin contact, according to some embodiments.

Referring now to FIG. 2, an intermediate step 200 for forming stacked transistors with a dummy fin contact is depicted, according to some embodiments. Intermediate steps 200-1400 (FIGS. 2-14) depict cross-sectional views of intermediate steps for forming the plurality of stacked transistors 1500 (FIG. 15). Put differently, FIGS. 2-14 depict the process of forming stacked transistors 1500 (FIG. 15).

In intermediate step 200, a layered substrate, such as a semiconductor on insulator type substrate, is formed. This type of layered substrate (for example a silicon on insulator (SOI) substrate or any other semiconductor on insulator substrate) may include insulator layers separating semiconductor layers (for instance, containing silicon). In some instances, as depicted in FIG. 2, the substrate may include semiconductor layers 230 and 210 separated by insulator layer 220. FIG. 2 also includes a second insulator layer 202. In some instances, the semiconductor layers 230 and 210 may be silicon (Si) layers and the insulator layers 202 and 220 may be oxide layers (for example, buried oxide (BOX) layers).

In some instances, as depicted in FIG. 2, insulator layer 220 and silicon layer 230 may be separated by a mask layer 203 (such as a silicon nitride ($Si_3N_4$) layer, for example). Mask layer 203 may help protect portions of the layered substrate from unwanted etching in future steps, discussed further herein. In some instances, the SOI substrate (including insulator layers 202 and 220, semiconductor layers 230 and 210, and mask layer 203) may be formed above a substrate 201. Substrate 201 may be silicon or may be other material(s). The insulator layers 202 and 220, the semiconductor layers 230 and 210, and the mask layer 203 may be deposited through methods such as atomic layer deposition (ALD), chemical vapor deposition (CVD), laser induced chemical vapor deposition (LCVD), and/or any other applicable deposition technique. In some instances, one or more of the layers (202, 203, 230, 220, and 210) may be deposited using the same technique; in some instances, each layer (202, 203, 230, 220, and 210) may be deposited using a different technique.

Figure 3:
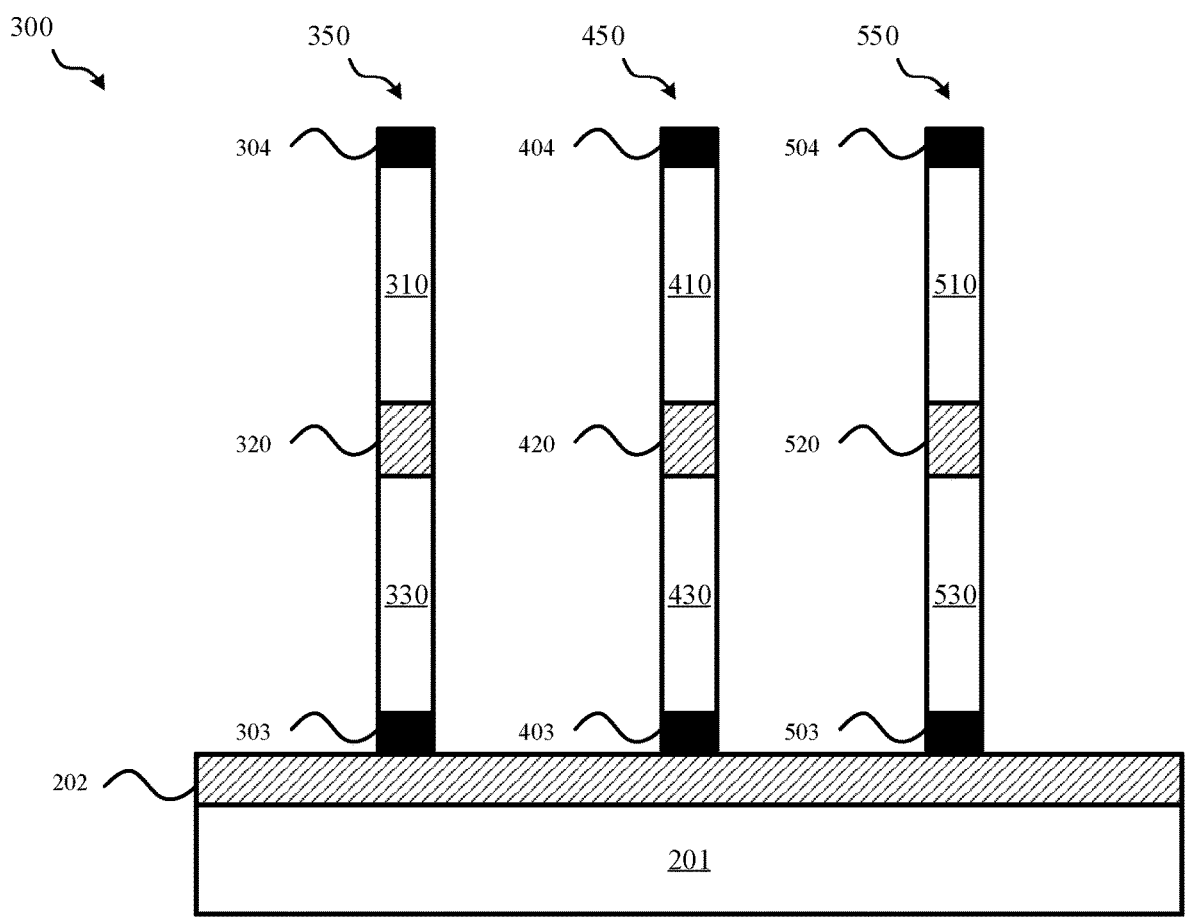
FIG. 3 depicts an intermediate step of forming fins, according to some embodiments.

Referring to FIG. 3, an intermediate step 300 of forming fins 350, 450, and 550 is depicted, according to some embodiments. Although FIG. 3 depicts three fins 350, 450, and 550, a chip and/or system may include any number of fins.

To form the fins, mask layer 203, insulator layer 220, and semiconductor layers 230 and 210 are etched to form three fins 350, 450, and 550. Specifically, mask layer 203, insulator layer 220, and semiconductor layers 230 and 210 may be patterned to remove excess material and form a fin. The patterning may include etching (such as reactive ion etching (RIE)), in some instances. Once formed, fin 350 includes a mask 303, semiconductor 330, insulator 320, and semiconductor 310; fin 450 includes a mask 403, semiconductor 430, insulator 420, and semiconductor 410; and fin 550 includes a mask 503, semiconductor 530, insulator 520, and semiconductor 510. Mask 303, mask 403, and mask 503 are all formed from mask layer 203 (FIG. 2), however masks 303, 403, and 503 have been renumbered for clarification's sake in order to correspond to their fins 350, 450, and 550, respectively. Similarly, semiconductors 330, 430, and 530 are formed from semiconductor layer 330 (FIG. 2); insulators 320, 420, and 520 are formed from insulator layer 220 (FIG. 2); and semiconductors 310, 410, and 510 are formed from semiconductor layer 210 (FIG. 2), but semiconductors 330, 430, and 530; insulators 320, 420, and 520; and semiconductors 310, 410, and 510 have been renumbered for clarification sake in order to correspond to their fins 350, 450, and 550, respectively.

As depicted in FIG. 3, fins 350, 450, and 550 may also include masks 304, 404, and 504, respectively. In some instances, a single mask layer (not depicted) was deposited on top of semiconductor layer 210 (FIG. 2) prior to any etching, and the single mask layer was etched to form masks 304, 404, and 504. In some instances, masks 304, 404, and 504 were deposited after the patterning and etching discussed above. Masks 304, 404, and 504 may protect semiconductors 310, 410, and 510 (respectively) from any unwanted etching.

In some instances, semiconductors 310, 330, 410, 430, 510, and 530 become channels for their corresponding transistors. For instance, semiconductor 330 is a channel for a first transistor (e.g., a PFET) of fin 350 and semiconductor 310 is a channel for a second transistor (e.g., an NFET) of fin 350; semiconductor 430 is a channel for a first transistor of fin 450 and semiconductor 410 is a channel for a second transistor of fin 450; and semiconductor 530 is a channel for a first transistor of fin 550 and semiconductor 510 is a channel for a second transistor of fin 550. Therefore, semiconductors 310, 330, 410, 430, 510, and 530 may also be referred to herein as channels 310, 330, 410, 430, 510, and 530. The components of the various stacked transistors may be discussed further herein.

Figure 4:
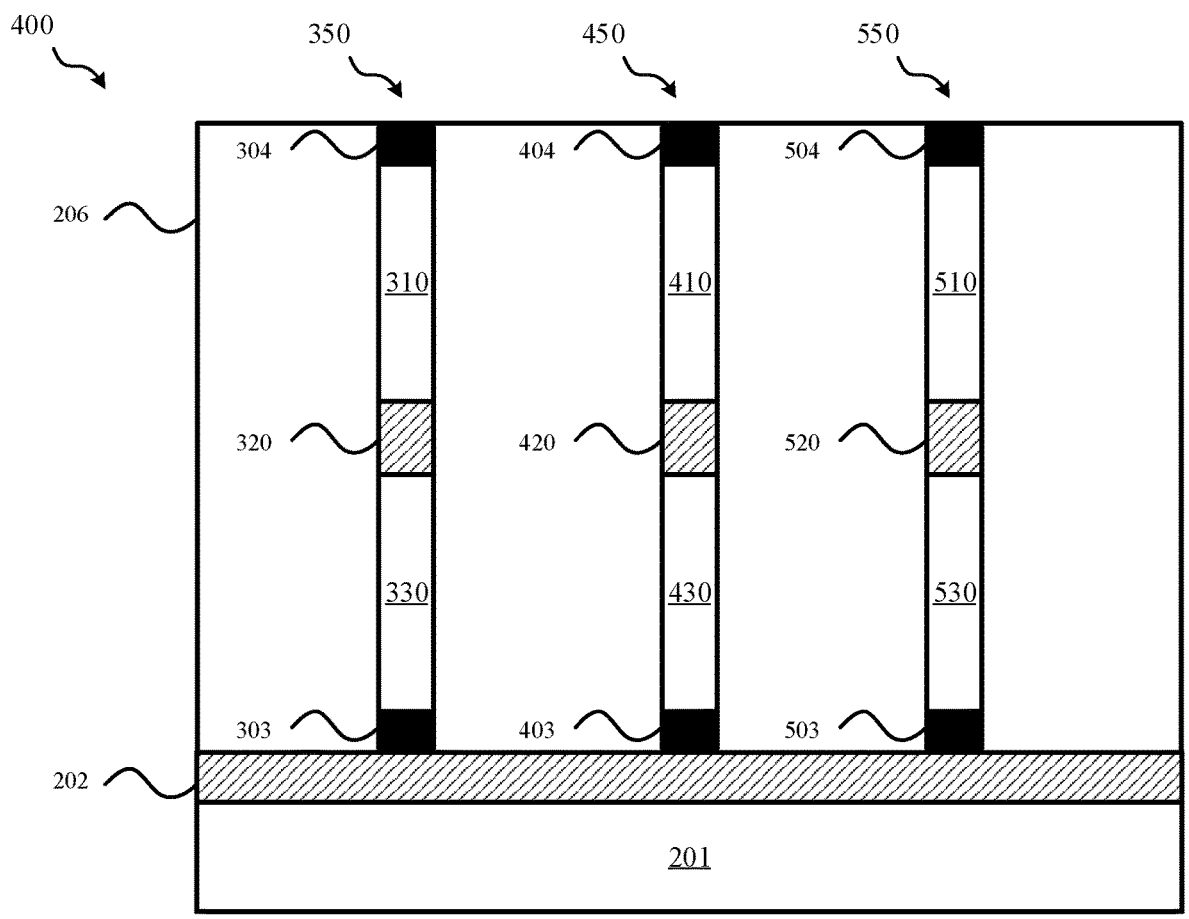
FIG. 4 depicts an intermediate step of depositing a sacrificial fill material, according to some embodiments.

Referring to FIG. 4, an intermediate step 400 of depositing a sacrificial fill material 206 is depicted, according to some embodiments. Sacrificial fill material 206 may be a temporary fill used to help in the formation process and to save space for future components of the stacked transistors. In some instances, sacrificial fill material 206 is a material such as silicon germanium (SiGe) or any other fill material. In some instances, sacrificial fill material 206 is deposited through a process such as ALD, CVD, LCVD, and/or any other applicable deposition technique. The sacrificial fill material 206 may be smoothed/polished through chemical mechanical planarization (CMP), in some instances.

Figure 5:
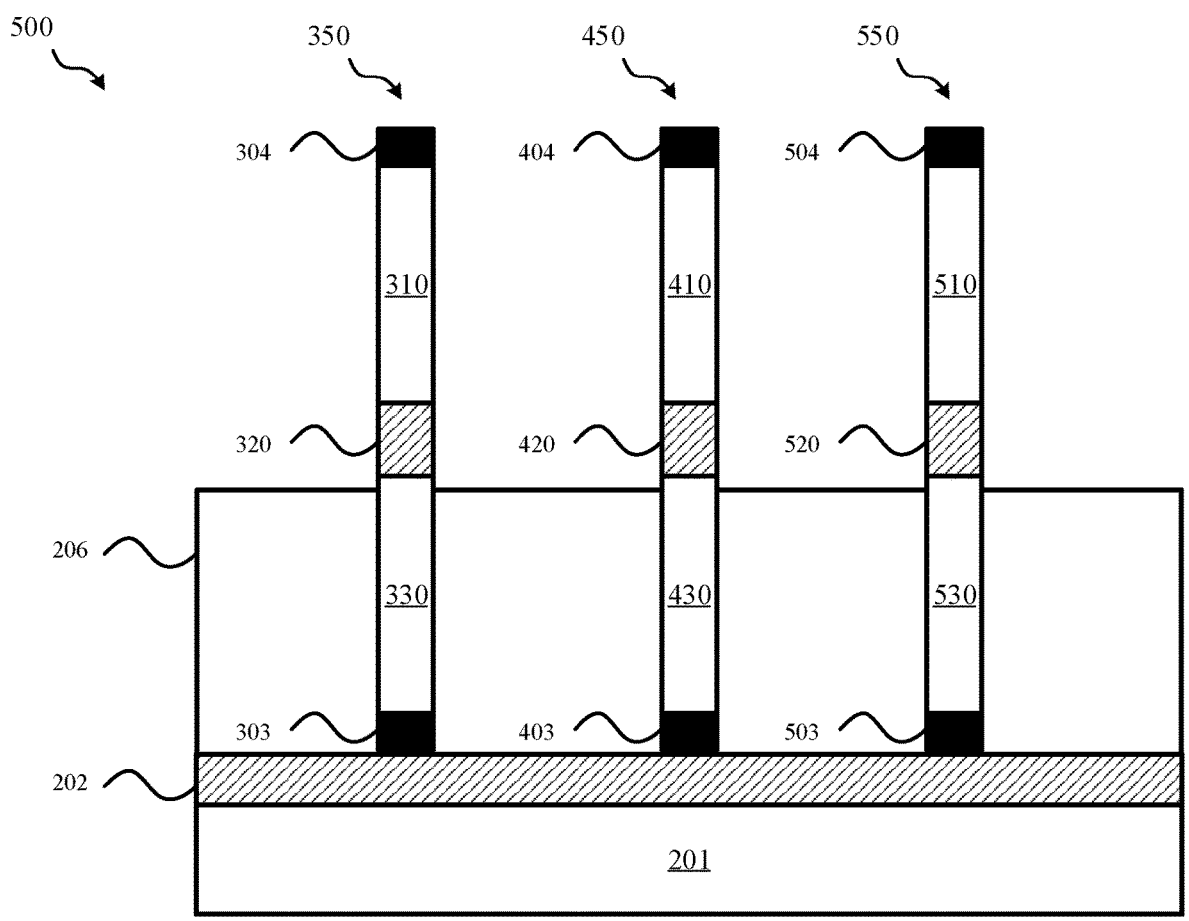
FIG. 5 depicts an intermediate step of etching back the sacrificial fill material, according to some embodiments.

Referring to FIG. 5, an intermediate step 500 of etching back the fill material 206 is depicted, according to some embodiments. As discussed above, the formation process of forming the sets of stacked transistors may include forming the top transistor, flipping the wafer such that the top transistor becomes the bottom transistor, and then forming the new top transistor. Therefore, only the top portions of the fins 350, 450, and 550 may be needed when forming the first transistors (i.e., what will become the bottom transistors once the wafer is flipped). Thus, the sacrificial fill material 206 may be etched back to grant access to the top portions (e.g., insulators 320, 420, and 520; channels 310, 410, and 510; and masks 304, 404, and 504) of the fins 350, 450, and 550. Sacrificial fill material 206 may also serve as a resting point for various layers of material to be deposited on top of, in some instances.

Figure 6:
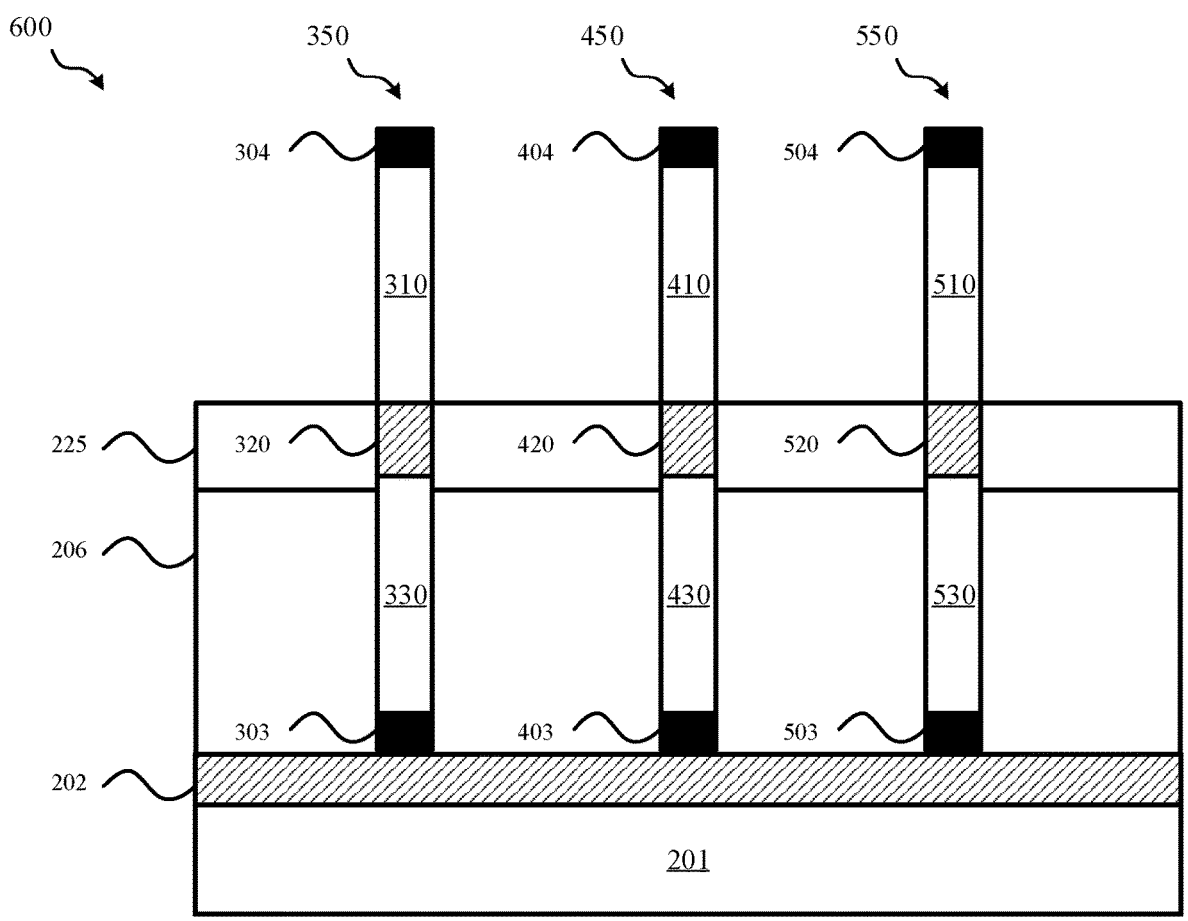
FIG. 6 depicts an intermediate step of forming an isolation layer, according to some embodiments.

Referring to FIG. 6, an intermediate step 600 of forming an isolation layer 225 is depicted, according to some embodiments. Isolation layer 225 may be formed by depositing a layer of isolation material on top of (or proximately connected to) the sacrificial fill material 206. In some instances, isolation layer 225 is deposited through a direct deposition technique. In some instances, isolation layer 225 is a dielectric material such as silicon dioxide ($SiO_2$), silicon nitride (SiN), or any other dielectric material. Isolation layer 225 may be used to help isolate the various components of the top transistor and the bottom transistor.

Figure 7:
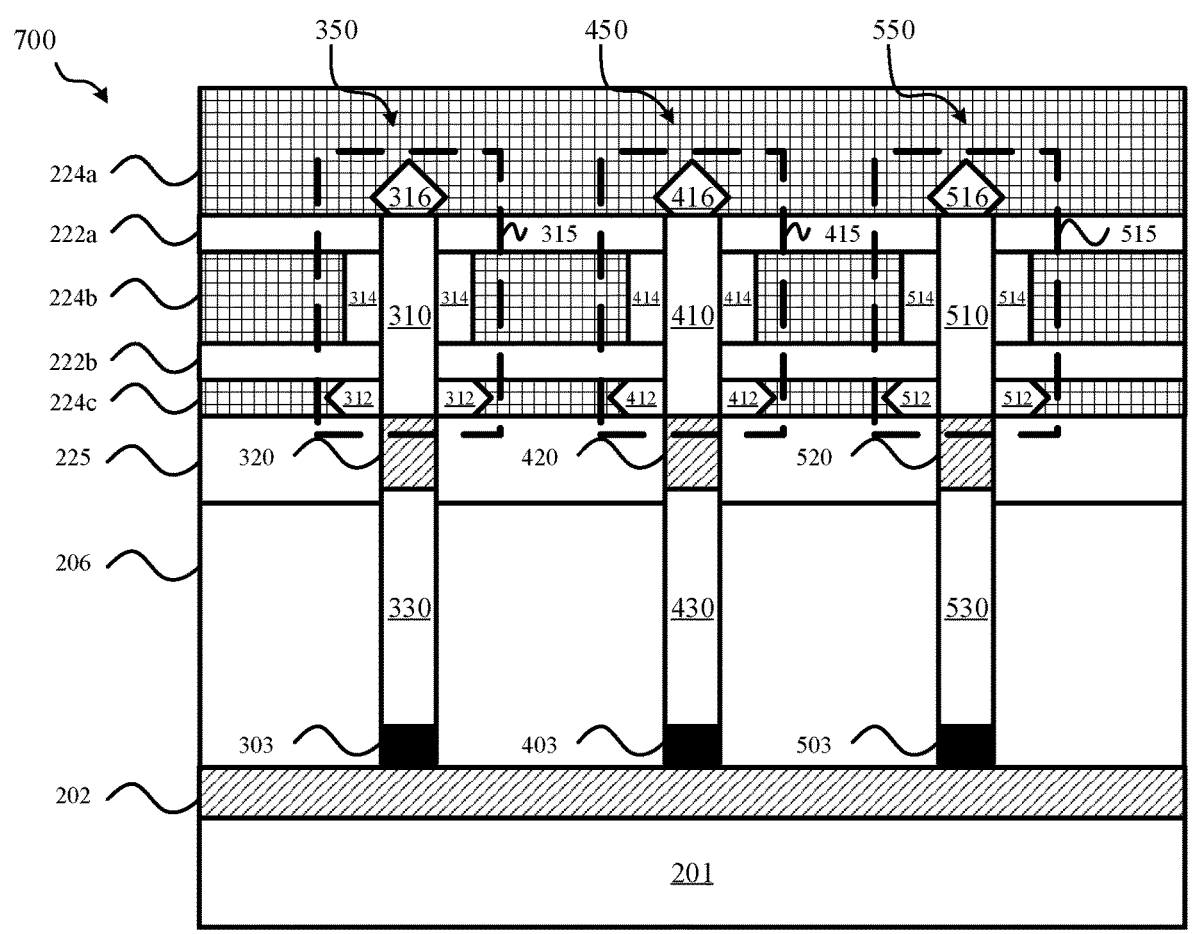
FIG. 7 depicts an intermediate step of finishing a bottom FET process, according to some embodiments.

Referring to FIG. 7, an intermediate step 700 of forming bottom transistors 315, 415, and 515 for each fin 350, 450, and 550 is depicted, according to some embodiments. As discussed herein, although the transistors 315, 415, and 515 are currently near the top of the wafer (as they are on a top portion of the fins), the wafer will eventually be flipped and the transistors 315, 415, and 515 will become towards the bottom of the wafer. Therefore, the transistors 315, 415, and 515 will be described herein as bottom transistors 315, 415, and 515, even though they are currently on top portions of the fins 350, 450, and 550. In some instances, bottom transistors 315, 415, and 515 may be formed concurrently.

To form bottom transistors 315, 415, and 515, top S/Ds 312, 412, and 512 are formed. Although top S/Ds 312, 412, and 512 are currently in a bottom portion of transistors 315, 415, and 515, respectively, the wafer has not been flipped yet. Once the wafer has been flipped (discussed further herein) top S/Ds 312, 412, and 512 will be in a top portion of the transistors 315, 415, and 515 (and are thus referred to as top S/Ds). In some instances, the top S/Ds 312, 412, and 512 may be formed through growing a top epitaxial (epi). The top epis may be the top S/Ds 312, 412, and 512, in some instances. In some instances, the top epis/the top S/Ds (312, 412, and 512) may be a crystalline structure and may be made of silicon. The top epis 312, 412, and 512 may be grown through chemical vapor deposition (CVD), vapor-phase epitaxy (VPE), or any other epi growth technique. Although the top S/Ds 312, 412, and 512 are depicted as irregular pentagons, the bottom S/Ds 312, 412, and 512 may be any shape.

In addition, a dielectric layer 224c is be deposited. The dielectric layer may help protect the top S/Ds 312, 412, and 512. In some instances, the dielectric layer 224c may surround the sidewalls of the top S/Ds 312, 412, and 512. A gate spacer 222b is also deposited on top of the dielectric layer 224c. Gate spacers may be used to help achieve the proper spacing between the various components of the bottom transistors 315, 415, and 515. In this instance, gate spacer 222b, may be used to create the proper/necessary spacing between S/Ds 312, 412, 512 and gates 314, 414, 514.

Gates 314, 414, and 514 are formed on top of gate spacer 222b. In some instances, gates 314, 414, and 514 wrap around the fin (for example, surrounding a portion of channels 310, 410, and 510). Forming gates 314, 414, and 514 may include depositing a gate material and removing (for example, etching and/or patterning) any unnecessary excess material. In some instances, the gate material may be deposited through atomic layer deposition (ALD), chemical vapor deposition (CVD), laser induced chemical vapor deposition (LCVD), and/or any other applicable deposition technique. Gates 314, 414, and 514 may be made up of materials (i.e., gate material(s)) such as titanium nitride (TiN), titanium aluminum carbide (TiAlC), and/or any other applicable gate materials. Another dielectric layer 224b is deposited to help protect the gates 314, 414, and 514. Dielectric layer 224b may be surrounding the gates 314, 414, and 514 in some instances. In some instances, dielectric layer 224b may fill in open spaces between the gates 314, 414, and 514 and on the outside sidewalls of the gates 314 and 514.

Once gates 314, 414, and 514 have been formed, another gate spacer 222a may be deposited above gates 314, 414, and 514 and dielectric layer 224b. Bottom S/Ds 316, 416, and 516 are formed above the gate spacer layer 222a and/or proximately connected to channels 310, 410, and 510, in some instances. Similar to top S/Ds 312, 412, and 512, bottom S/Ds 316, 416, and 516 are referred to as such because they will be in a bottom portion of transistors 315, 415, and 515 once the wafer is flipped. In some instances, bottom S/Ds 316, 416, and 516 are formed using the same/similar methods as forming the top S/Ds 312, 412, and 512. Another dielectric layer 224a may be deposited on top of gate spacer 222a. In some instances, dielectric layer 224a may surround the exposed areas of bottom S/Ds 316, 416, and 516.

The various dielectric layers 224a, 224b, and 224c and gate spacers 222a and 222b may be deposited through methods such as atomic layer deposition (ALD), chemical vapor deposition (CVD), laser induced chemical vapor deposition (LCVD), and/or any other applicable deposition technique.

Bottom transistors 315, 415, and 515, once formed, include channels 310, 410, and 510; top S/Ds 312, 412, and 512; gates 314, 414, and 514; and bottom S/Ds 316, 416, and 516, respectively.

Figure 8:
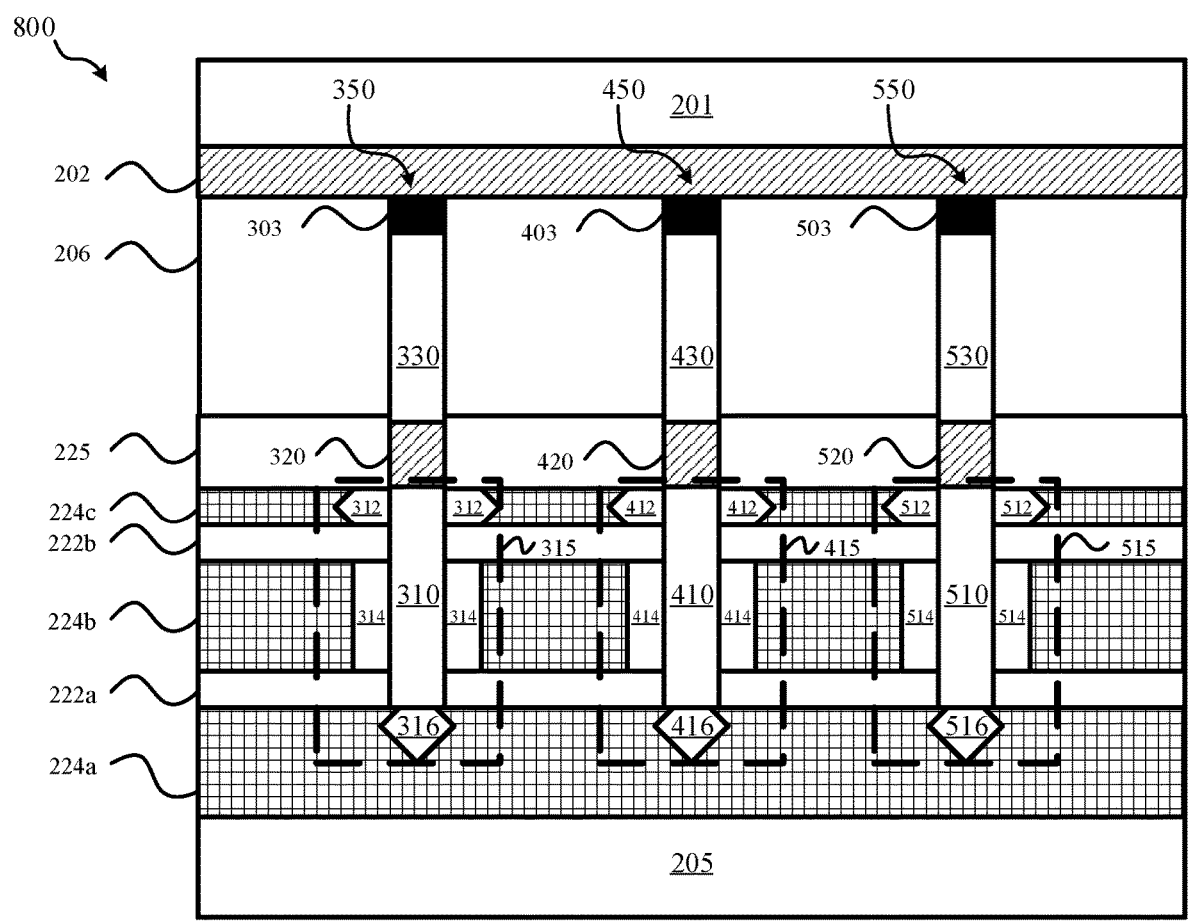
FIG. 8 depicts an intermediate step of flipping the wafer and bonding to a new substrate, according to some embodiments.

Referring now to FIG. 8, an intermediate step 800 of flipping the wafer and bonding to a new substrate 205 is depicted, according to some embodiments. Once the first transistors for each fin 350, 450, and 550 are formed, the entire wafer is flipped such that the top of the wafer becomes the bottom, and vice versa. Therefore, substrate 201, which was previously on the bottom of the wafer, is now the top substrate. Further, when flipping the wafer, the new bottom portion of the wafer (e.g., dielectric layer 224a) may be bonded to a new substrate 205. Substrate 205 may be silicon, in some instances, or may be any other material. In some instances, substrate 205 may be an existing component(s) of a chip in which the stacked transistors will be connected to and/or will sit on top of.

Figure 9:
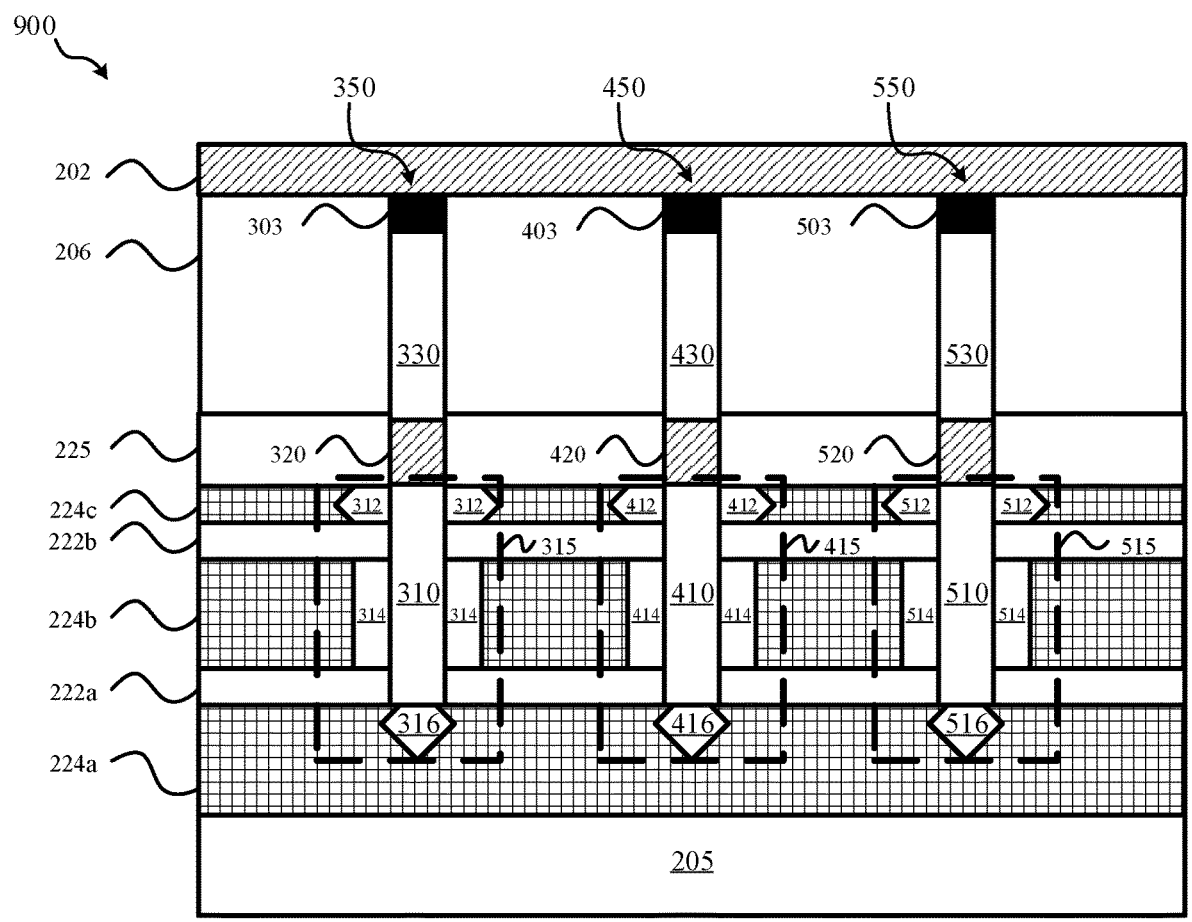
FIG. 9 depicts an intermediate step of removing the original substrate, according to some embodiments.

Referring to FIG. 9, an intermediate step 900 of removing the original substrate 201 is depicted, according to some embodiments. Once the wafer has flipped, the substrate 201 that the components originally sat on top of may no longer be needed, as it is now on top of the components. Therefore, substrate 201 may be removed from the wafer. Substrate 201 may be removed through RIE, CMP, or any other removal technique.

Figure 10:
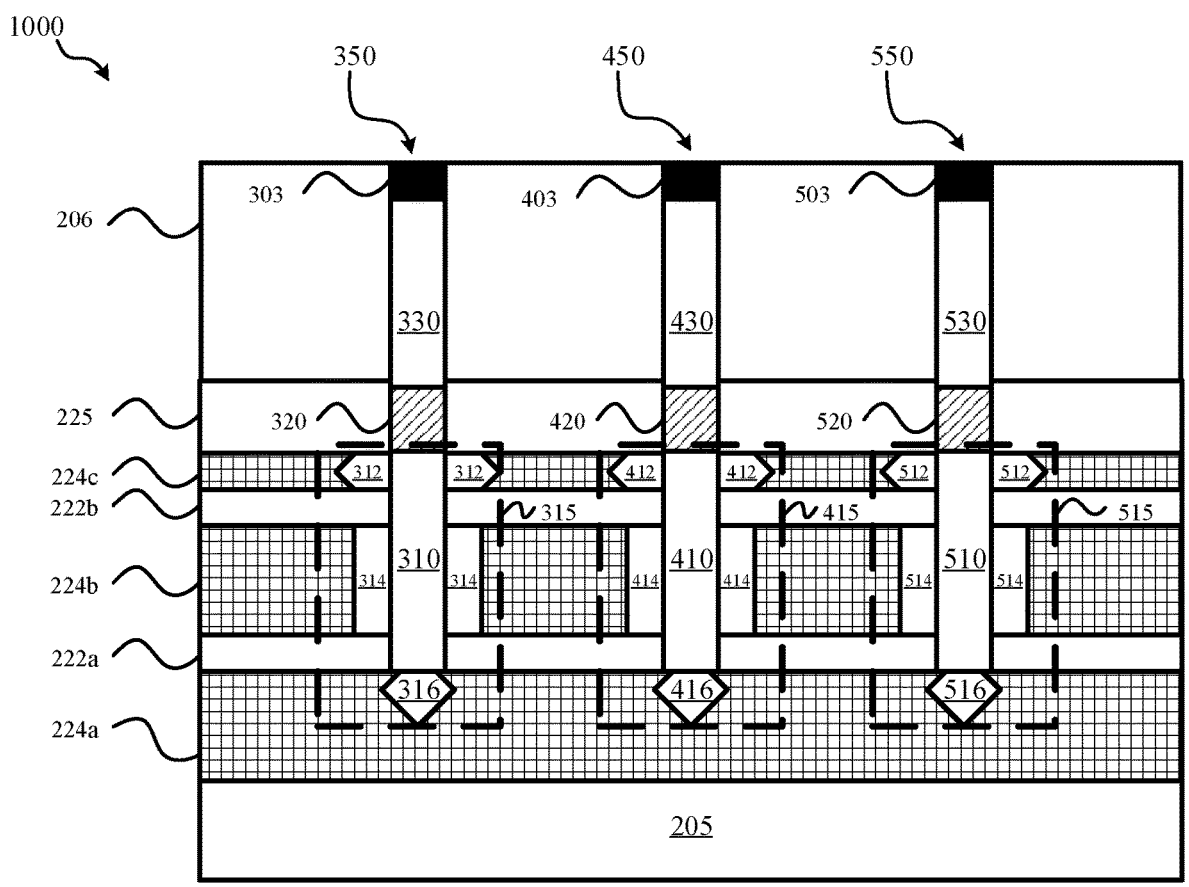
FIG. 10 depicts an intermediate step of removing the etch stop layer, according to some embodiments.

Referring to FIG. 10, an intermediate step 1000 of removing the insulator layer 202 is depicted, according to some embodiments. In some instances, insulator layer 202 may have been an etch stop layer that served as a stopping point for initially forming the fins 350, 450, and 550 (discussed herein and depicted in FIG. 3) and may have protected substrate 201 or any other components of the system from being unnecessarily etched. However, now that the wafer has flipped, insulator layer 202 may no longer be needed and may be removed. Insulator layer 202 may be removed through RIE, CMP, or any other removal technique.

Figure 11:
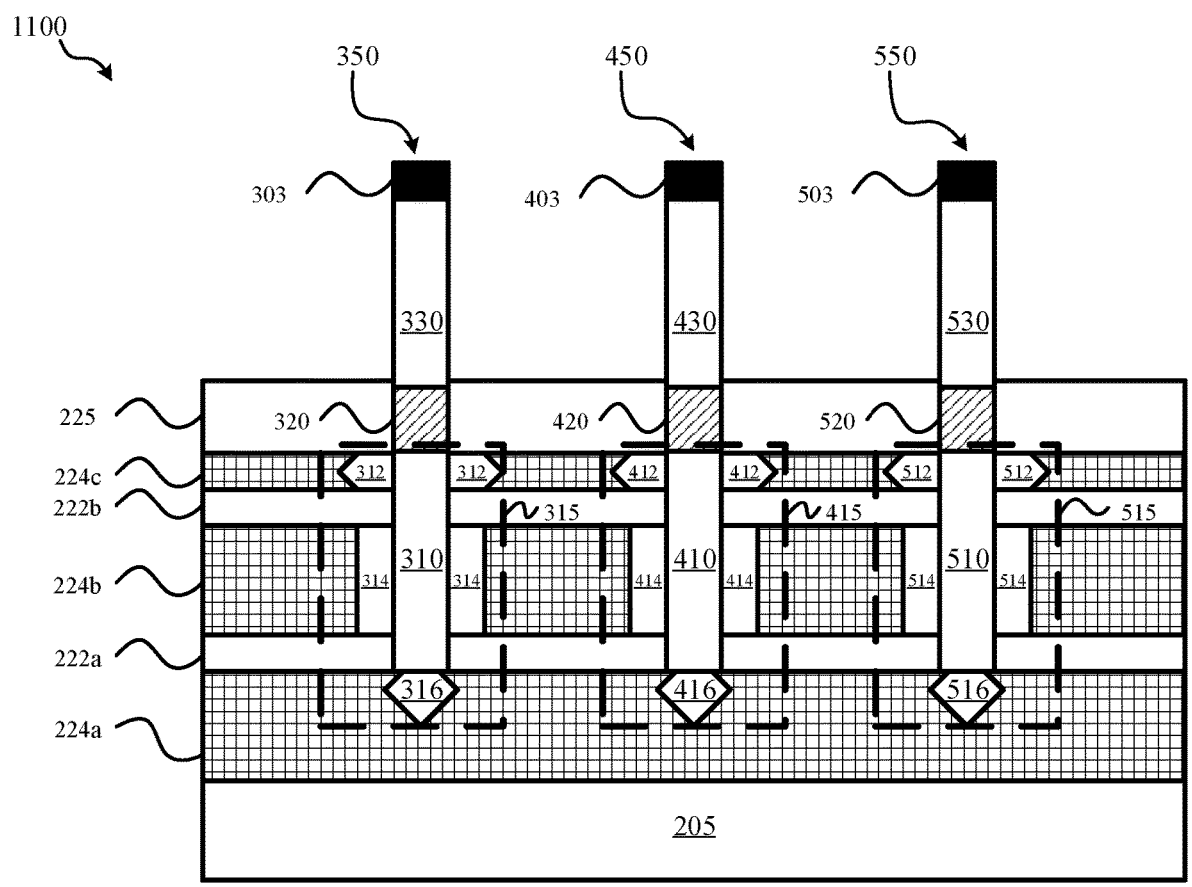
FIG. 11 depicts an intermediate step of removing the remaining sacrificial fill material, according to some embodiments.

Referring to FIG. 11, an intermediate step 1100 of removing the remaining sacrificial fill material 206 is depicted, according to some embodiments. Sacrificial fill material 206 may no longer be needed and may be removed. The sacrificial fill material 206 may be removed through RIE, CMP, or any other removal technique. During the removal process, masks 303, 403, and 503 remain in order to help prevent unwanted removal of portions of channels 330, 430, and 530.

Figure 12:
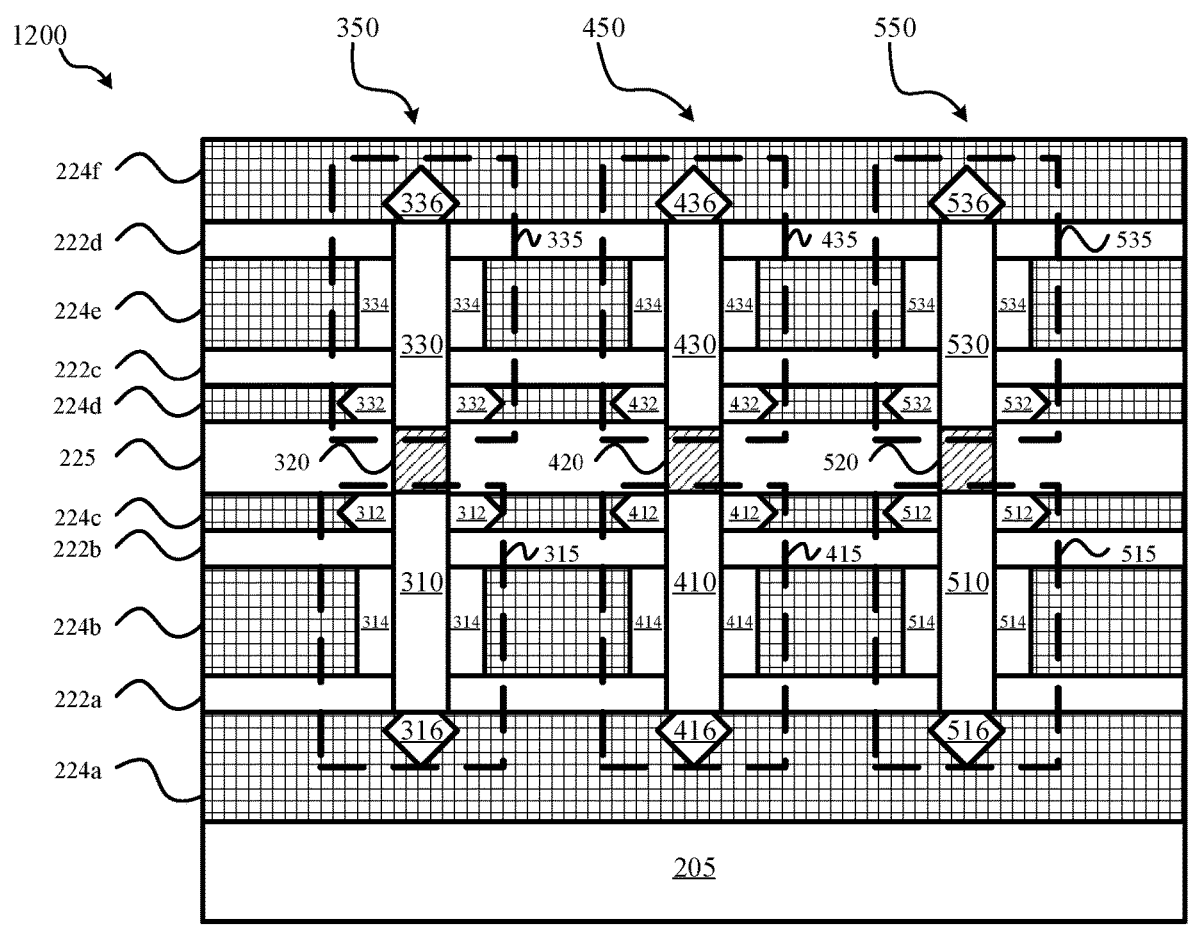
FIG. 12 depicts an intermediate step of finishing a top FET process, according to some embodiments.

Referring to FIG. 12, an intermediate step 1200 of forming top transistors (i.e., top FETs) 335, 435, and 535 is depicted, according to some embodiments. In some instances, top transistors 335, 435, and 535 may be formed using the same/similar methods as forming the bottom transistors 315, 415, and 515 (discussed herein and depicted in FIG. 7). Top transistors 335, 435, and 535 include bottom S/Ds 332, 432, and 532; channels 330, 430, and 530; gates 334, 434, and 534; and top S/Ds 336, 436, and 536, respectively. Further, similar to bottom transistors 315, 415, and 515, dielectric layers 224d-f (referred to collectively with dielectric layers 224a-c as dielectric layers 224) may be used to protect various components of the transistors and gate spacers 222c and d (referred to collectively with gate spacers 222a and b as gate spacers 222) may be used to help properly space out the various components (and, in some instances, to also help protect the various components).

Once the top transistors 335, 435, and 535 have been formed, the chip may include three sets of stacked transistors. The first set of stacked transistors, corresponding to fin 350, include a bottom transistor 315 and a top transistor 335. The second set of stacked transistors, corresponding to fin 450, include a bottom transistor 415 and a top transistor 435. The third set of stacked transistors, corresponding to fin 550, include a bottom transistor 515 and a top transistor 535. In some instances, as depicted in FIG. 12, the top and bottom transistors are separated by insulators 320, 420, and 520, respectively, and isolation layer 225.

In some instances, the system and/or chip may have only needed a single transistor for fin 350, and the second transistor (top transistor 335) may not be required. However, because transistors 315, 415, and 515, and then 335, 435, and 535 were all being formed together in the same process, it may have been very challenging and/or time consuming to form the sets of stacked transistors for transistors 515/535 and 415/435 while only forming a single transistor 315 for fin 350, that is still accessible by the necessary components of the system. In these instances, the top transistor 335 may still be formed, even though it is not required, as it may be more efficient to form the transistor and then replace it with a contact (discussed further herein) instead of not forming the second transistor and reconfiguring the layout of the fin 350 so that transistor 315 is accessible.

Because transistor 335 is not being used as a transistor (as a second transistor is not needed for fin 350), transistor 335 is not designed to function as part of a logical circuit within the overall device, in some instances. Therefore, because transistor 335 is not designed/intended to function it may be referred to herein as a dummy transistor. Instead of wasting the space where the top transistor 335 is located by having a dummy transistor with no intended functionality, the dummy transistor may be pulled out/removed (or at least a portion of the transistor may be pulled out) and replaced to form a contact to the bottom transistor 315. This is further discussed herein.

Figure 13:
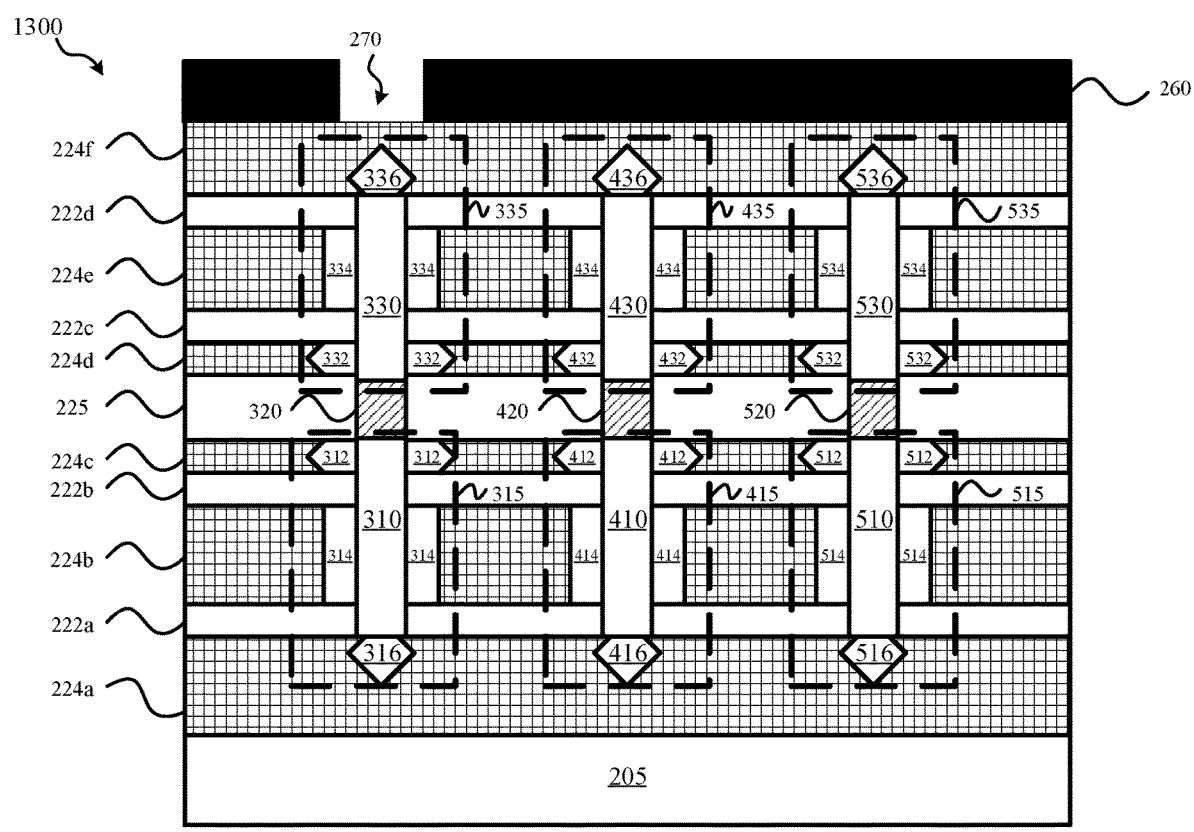
FIG. 13 depicts an intermediate step of depositing and patterning an etch mask layer, according to some embodiments.

Referring now to FIG. 13, an intermediate step 1300 of depositing and patterning an etch mask layer 260 is depicted, according to some embodiments. Because transistor 335 may not be needed, transistor 335 (for example, dummy transistor 335) is replaced, in this instance, by a contact, in order to grant access to transistor 315. Before forming a contact (discussed further herein), an etch mask layer 260 may be deposited in order to mask various components of the chip and protect them from removal and/or harm from the etching process. In some instances, the etch mask layer 260 may be deposited in a single layer (not depicted) on top of dielectric layer 224f. Once the etch mask layer 260 is deposited (for instance, using ALD, CVD, LCVD, and/or any other applicable deposition technique), an opening/via 270 is etched into the etch mask layer 260, exposing transistor 315. The opening 270 allows access to the various components of transistor 335 (e.g., 330, 332, 334, 336, etc.), so that they can be removed in order to create an opening for a contact (discussed further, herein). In some instances, opening 270 may be the desired width of the contact (e.g., contact 280 of FIG. 15). Etch stop layer 260 may be deposited through any applicable deposition technique. In some instances, etch stop layer 260 may be a photoresist material. In some instances, etch stop layer 260 may be a material such as TiN, TaN, etc.

Figure 14:
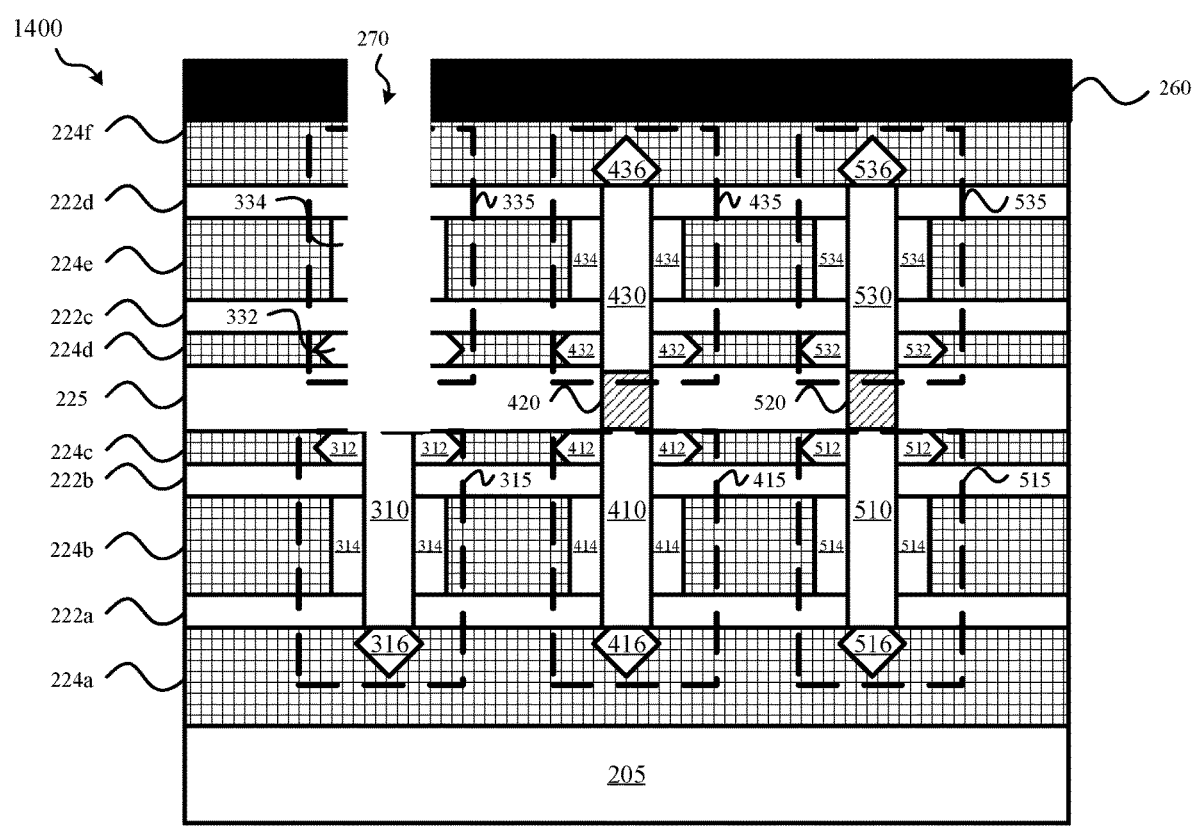
FIG. 14 depicts an intermediate step of etching an opening through a top transistor of a set of stacked transistors, according to some embodiments.
Figure 15:
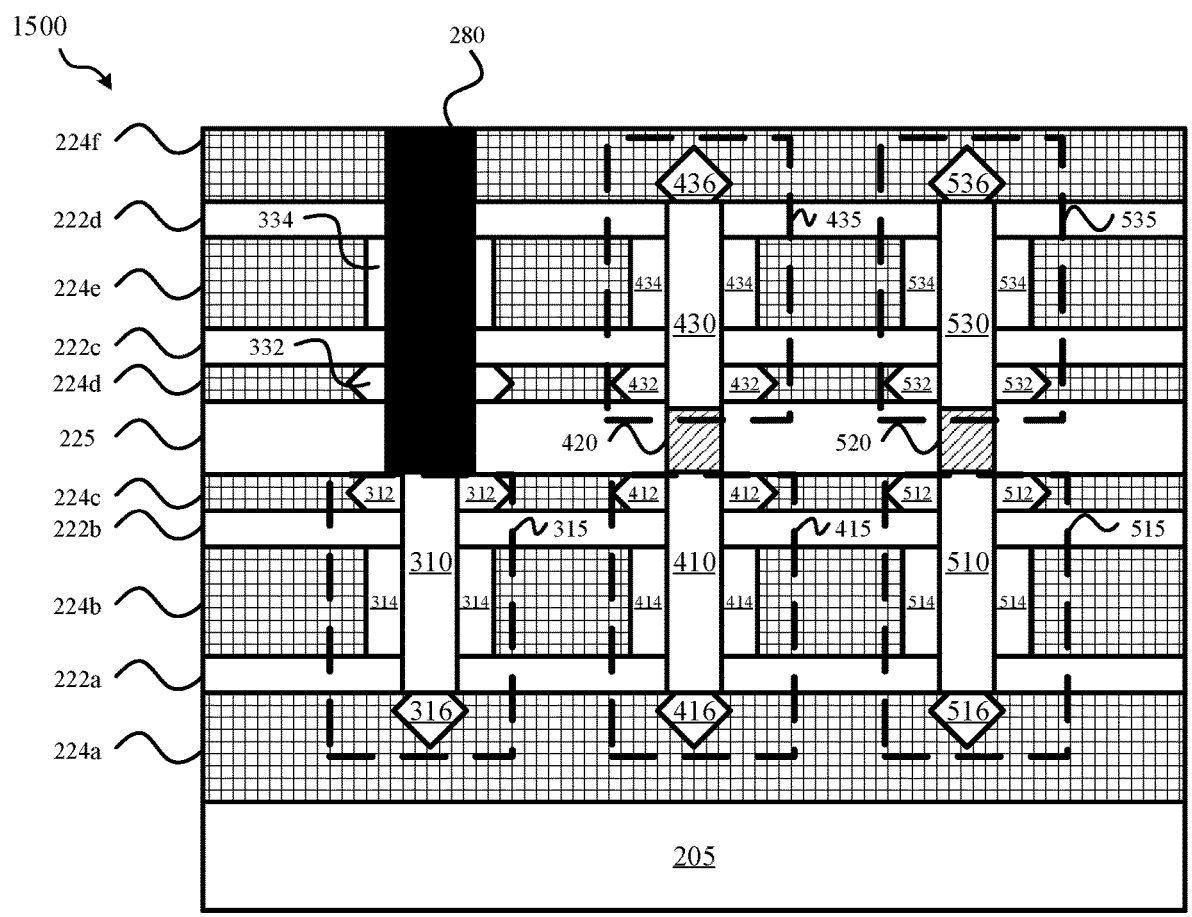
FIG. 15 depicts an exemplary plurality of stacked transistors including a dummy fin contact, according to some embodiments.

Referring to FIG. 14, an intermediate step 1400 of etching an opening through a top transistor 335 is depicted, according to some embodiments. In some instances, etching an opening includes extending the previously created opening 270 such that it extends through the components of the top transistor 335 and down to bottom transistor 315. This removes channel 330, and at least the majority of bottom S/D 332, gates 334, and top S/D 336. In some instances, the width of the opening/via 270 is determined based on how big the contact needs to be (i.e., the size of the contact). The width that is necessary for opening 270 may not be affected by the size of the components of transistor 335, or at least the opening 270 may not need to be large enough to remove the entirety of transistor 335, as transistor 335 may have no intended functionality and may be a dummy transistor. FIG. 14 depicts an instance where portions of the components 332 and 334 of the transistor 335 remain after the opening 270 has been created (and, as depicted in FIG. 15, will remain once the contact 280 has been formed). FIG. 1 depicts an instance where the entire transistor was removed to form the contact 170 (for example, based on the necessary size of the contact 170 (FIG. 1)). When portions of the components and of the transistor remain after the contact has been formed, the contact may be described as having a width less than the transistor that has been replaced, as some portions of the transistor still remain. When the entire transistor was removed and replaced by the contact (i.e., no portions of the transistor remain), the contact may be described as having a width greater than or equal to the transistor that has been replaced.

Referring to FIG. 15, an exemplary plurality of stacked transistors 1500 including two sets of stacked transistors (415, 435 and 515, 535) and a transistor-contact pair (315, 280) are depicted, according to some embodiments. After the opening 270 was extended down to transistor 315, the opening is filled with a conductive material. This may be a conductive material such as titanium nitride (TiN), tantalum nitride (TaN), titanium, copper, cobalt, tungsten, or any other conductive material. This results in a contact 280, which may form a contact/connection between bottom transistor 315 and other component(s) (not depicted) of the system. In some instances, planarization may also occur to smooth the surface(s) (such as the top surface of the wafer).

Because contact 280 replaced a dummy transistor 335 (FIG. 13) (also referred to as a dummy fin), contact 280 may also be referred to herein as a dummy fin contact 280. Dummy fin contact 280 is proximately and directly connected to bottom transistor 315 and connects the bottom transistor 315 with other components of the chip and/or the system. In some instances (not depicted), contact 280 may extend higher than dielectric layer 224f.

The term "replaced" has been used with respect to FIG. 15 to describe the process of removing the transistor 335 by etching an opening through the transistor 335 and filling that opening with the conductive material (resulting in contact 280). By doing this, the space taken up by the transistor 335 is now used as a contact 280. However, as discussed above and depicted in FIGS. 14 and 15, the entirety of the transistor 335 may not be fully removed from the wafer/chip. For instance, as depicted in FIG. 15, portions of gates 334 and bottom S/D 332 may remain. Therefore, the term replace, as used herein, may not refer to fully removing every component of a transistor, and instead may refer to inserting a contact into a space previously taken up by a transistor, even if some portion of the transistor may still remain in the space.

Stacked transistors 515 and 535; stacked transistors 415 and 435; and stacked transistor 315 and contact 280 may all be referred to as being in a stacked transistor structure. Even though transistor 315 and contact 280 may only include a single transistor, the transistor 315 and the contact 280 may still be in a stacked structure.

Although FIG. 15 depicts two sets of stacked transistors (stacked transistors 415/435 and stacked transistors 515/535) along with a transistor 315 and contact 280 pair, a chip may include any number of transistors and contacts. For example, a chip may include two transistor-contact pairs (i.e., a contact on top of a bottom transistor) and only a single set of stacked transistors (i.e., a top transistor on top of a bottom transistor). In another example, there may be three transistor-contact pairs and three sets of stacked transistors.

Further, although FIGS. 2-15 discuss a process of forming stacked transistors along with a transistor-contact pair, some embodiments of the present disclosure may include additional and/or alternative steps/processes than those explicitly presented in FIGS. 2-15. For instance, there may have been step(s) taken to recess various layers in the stack such as the dielectric layers, gate spacers, epi (i.e., S/D), etc. In some instances, a high-k dielectric may have been added near the channel(s) 310, 410, 430, 510, and/or 530 to act as a gate dielectric and induce charges in the channels 310, 410, 430, 510, and/or 530 through a capacitive effect. In some instances, although it is discussed that the contact 280 may be formed after the dummy transistor 335 was fully formed, there may be some instances where the contact 280 is formed prior to the completion of forming the top transistors 335, 435, and 535. For instance, the contact 280 may be formed prior to the formation of top S/Ds 336, 436, and 536 (discussed in relation to FIG. 12). Once the contact 280 was formed, the contact 280 may be capped in order to prevent any S/D formation on top of the contact. Then, the top S/Ds 436 and 536 may be formed using the methods discussed herein, and the cap on top of contact 280 may be removed.

Figure 16:
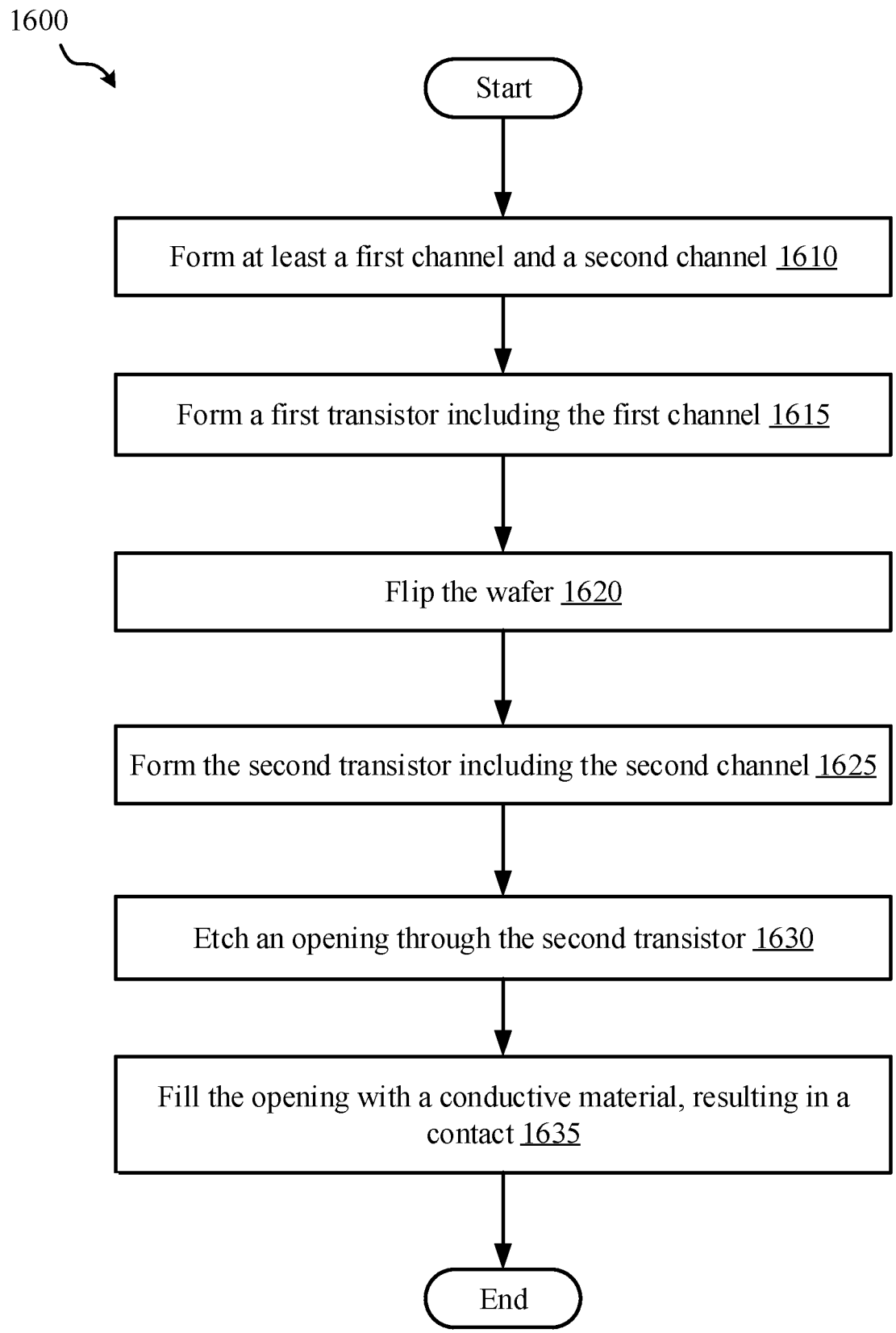
FIG. 16 depicts a flowchart of an exemplary method of forming a vertically stacked transistor structure, according to some embodiments.

Referring to FIG. 16, a flowchart of a method 1600 of forming a vertically stacked transistor structure (such as transistor structure 100 (FIG. 1) and/or transistor structure 1500 (FIG. 15) is depicted, according to some embodiments. Method 1600 includes operation 1610 to form at least a first channel and a second channel. In some instances, only a first channel and a second channel are formed (for example, when forming transistor structure 100 (FIG. 1)). In some instances, more than two channels are formed (for example, a third and fourth channel, or even a fifth and sixth channel). This may correspond to a structure such as transistor structure 1200 (FIG. 12), where there are multiple sets of stacked transistors. Operation 1610 may correspond to intermediate steps 200 (FIG. 2) and/or 300 (FIG. 3), in some instances. In some instances, forming the first channel includes forming the first channel on top of the second channel.

Method 1600 includes operation 1615 to form a first transistor including the first channel. Similar to forming the channels, in some instances only a first transistor is formed in operation 1615 (for example, when forming transistor structure 100 (FIG. 1)). In some instances, a plurality of sets of stacked transistors are being formed simultaneously, therefore a plurality of transistors may be formed here (for example, when forming transistor structure 1200 (FIG. 12)). In some instances, operation 1615 corresponds to intermediate steps 400 (FIG. 4), 500 (FIG. 5), 600 (FIG. 6), and/or 700 (FIG. 7).

Method 1600 includes operation 1620 to flip the wafer. In some instances, the wafer is flipped prior to forming the second transistor, and the first channel (and the first transistor) are below the second channel after the flip. Operation 1620 may correspond to intermediate step 800 (FIG. 8).

Method 1600 includes operation 1625 to form the second transistor including the second channel. This operation may include forming a single second transistor (e.g., a top transistor) or forming a plurality of top transistors. In some instances, operation 1625 corresponds to intermediate steps 800 (FIG. 8), 900 (FIG. 9), 1000 (FIG. 10), 1100 (FIG. 11), and/or 1200 (FIG. 12).

Method 1600 includes operation 1630 to etch an opening through the second transistor. This may correspond to intermediate steps 1300 (FIG. 13) and/or 1400 (FIG. 14). Method 1600 also includes operation 1635 to fill the opening with a conductive material, resulting in a contact. Operation 1635 may correspond to step 1500 (FIG. 15).

Figure 17:
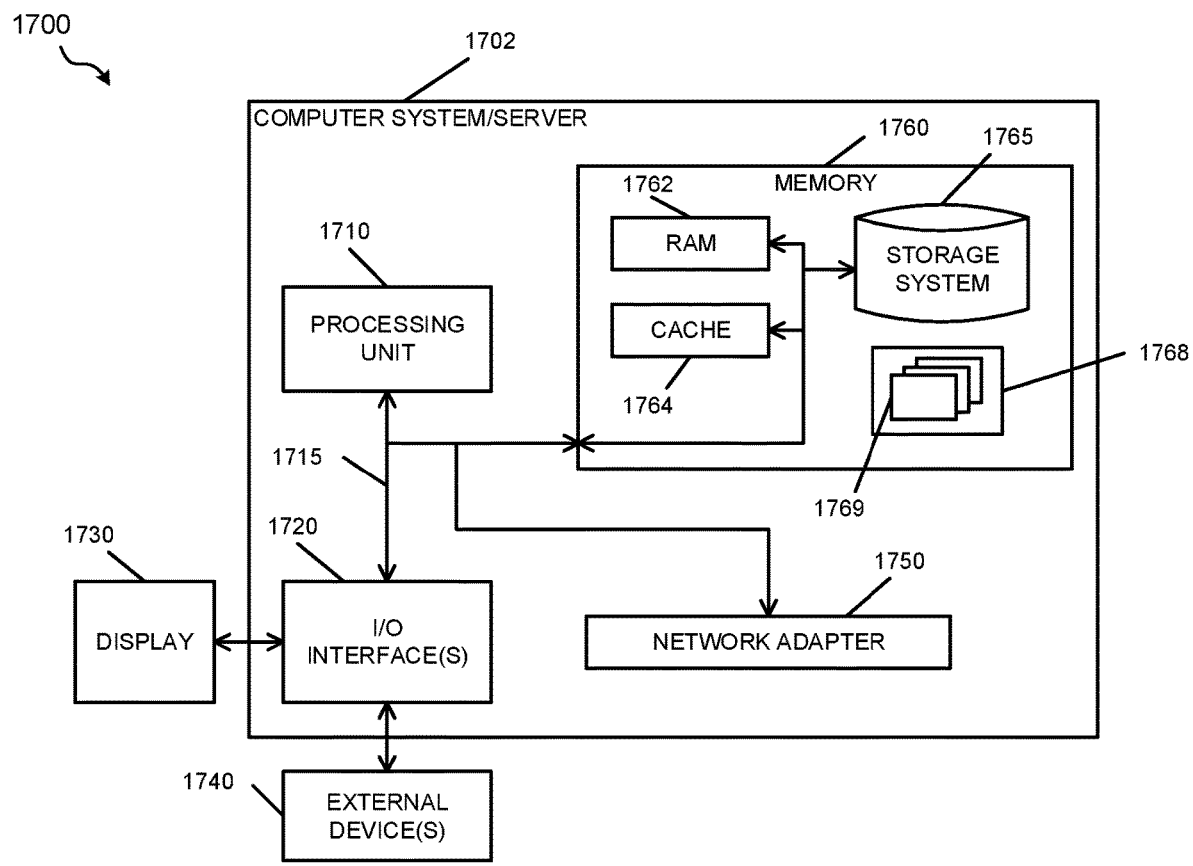
FIG. 17 depicts a block diagram of a sample computer system, according to some embodiments.

Referring now to FIG. 17, computer system 1700 is a computer system/server 1702 is shown in the form of a general-purpose computing device, according to some embodiments. In some instances, stacked transistor structure 100 (FIG. 1), plurality of stacked transistors 1500 (FIG. 15), etc. may be a part of computer system 1700 and/or computer system/server 1702. The components of computer system/server 1702 may include, but are not limited to, one or more processors or processing units 1710, a system memory 1760, and a bus 1715 that couples various system components including system memory 1760 to processor 1710.

Bus 1715 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1702 typically includes a variety of computer system readable media. Such media may be any available media that is accessible by computer system/server 1702, and it includes both volatile and non-volatile media, removable and non-removable media.

System memory 1760 can include computer system readable media in the form of volatile memory, such as random-access memory (RAM) 1762 and/or cache memory 1764. Computer system/server 1702 may further include other removable/non-removable, volatile/non-volatile computer system storage media. By way of example only, storage system 1765 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1715 by one or more data media interfaces. As will be further depicted and described below, memory 1760 may include at least one program product having a set (e.g., at least one) of program modules that are configured to carry out the functions of embodiments of the disclosure.

Program/utility 1768, having a set (at least one) of program modules 1769, may be stored in memory 1760 by way of example, and not limitation, as well as an operating system, one or more application programs, other program modules, and program data. Each of the operating system, one or more application programs, other program modules, and program data or some combination thereof, may include an implementation of a networking environment. Program modules 1769 generally carry out the functions and/or methodologies of embodiments of the invention as described herein.

Computer system/server 1702 may also communicate with one or more external devices 1740 such as a keyboard, a pointing device, a display 1730, etc.; one or more devices that enable a user to interact with computer system/server 1702; and/or any devices (e.g., network card, modem, etc.) that enable computer system/server 1702 to communicate with one or more other computing devices. Such communication can occur via Input/Output (I/O) interfaces 1720. Still yet, computer system/server 1702 can communicate with one or more networks such as a local area network (LAN), a general wide area network (WAN), and/or a public network (e.g., the Internet) via network adapter 1750. As depicted, network adapter 1750 communicates with the other components of computer system/server 1702 via bus 1715. It should be understood that although not shown, other hardware and/or software components could be used in conjunction with computer system/server 1702. Examples include, but are not limited to: microcode, device drivers, redundant processing units, external disk drive arrays, RAID systems, tape drives, and data archival storage systems, etc.

The present invention may be a system, a method, a computer program product, etc. at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electronic signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object orientated program language such as Smalltalk, C++, or the like, and procedural programming languages, such as the "C" programming language or similar programming languages. The computer readable program instructions may execute entirely one the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A plurality of transistor components, wherein the plurality of transistor components comprises:

a first bottom transistor, wherein the first bottom transistor comprises a channel, a gate, a source, and a drain;

a first dummy fin contact on top of the first bottom transistor, wherein the first dummy fin contact is proximately connected to the first bottom transistor, and the first dummy fin contact replaces a portion of a first top transistor, wherein the first top transistor is a dummy transistor; and a first set of stacked transistors, wherein the first set of stacked transistors comprises a second top transistor on top of a second bottom transistor.

2. The plurality of transistor components of claim 1, further comprising:

a third bottom transistor; and a second dummy fin contact on top of either the second bottom transistor or the third bottom transistor, wherein the second dummy fin contact is proximately connected to either the second bottom transistor or the third bottom transistor, and wherein the second dummy fin contact replaces a portion of the second top transistor or a portion of a third top transistor.

3. The plurality of transistor components of claim 1, further comprising:

a second set of stacked transistors, wherein the second set of stacked transistors comprises a third top transistor on top of a third bottom transistor.

4. The plurality of transistor components of claim 1, wherein the dummy fin contact comprises at least one selected from a group consisting of: TiN, TaN, titanium, copper, cobalt, and tungsten.

5. The plurality of transistor components of claim 1, wherein the first dummy fin contact has a width less than the first top transistor.

6. The plurality of transistor components of claim 1, wherein the first dummy fin contact has width equal to the first top transistor.

7. A semiconductor device comprising:
 a plurality of transistor components, wherein the plurality of transistor components comprises:
 a first bottom transistor, wherein the first bottom transistor comprises a channel, a gate, a source, and a drain; and
 a first dummy fin contact on top of the first bottom transistor, wherein the first dummy fin contact is proximately connected to the first bottom transistor, and wherein the first dummy fin contact replaces a portion of a first top transistor, wherein the first top transistor is a dummy transistor;
 wherein the plurality of transistor components further comprises:
 a first set of stacked transistors, wherein the first set of stacked transistors comprises a second top transistor on top of a second bottom transistor.

8. The system semiconductor device of claim 7, wherein the plurality of transistor components further comprises:
 a third bottom transistor; and
 a second dummy fin contact on top of either the second bottom transistor or the third bottom transistor, wherein the second dummy fin contact is proximately connected to either the second bottom transistor or the third bottom transistor, and wherein the second dummy fin contact replaces either a portion of the second top transistor or a portion of a third top transistor.

9. The system semiconductor device of claim 7, wherein the plurality of transistor components further comprises:
 a second set of stacked transistors, wherein the second set of stacked transistors comprises a third top transistor on top of a third bottom transistor.

10. The semiconductor device of claim 7, wherein the first dummy fin contact has a width less than the first top transistor.

11. The semiconductor device of claim 7, wherein the first dummy fin contact has width equal to the first top transistor.

* * * * *